(12) United States Patent
Mattisson et al.

(10) Patent No.: US 6,188,275 B1
(45) Date of Patent: Feb. 13, 2001

(54) DEMODULATOR TUNED BY USE OF A TEST SIGNAL

(75) Inventors: Sven Mattisson, Bjärred (SE); Jacobus Haartsen, Borne (NL)

(73) Assignee: Telefonaktiebolaget LM Ericsson (publ), Stockholm (SE)

(*) Notice: Under 35 U.S.C. 154(b), the term of this patent shall be extended for 0 days.

(21) Appl. No.: 09/274,479

(22) Filed: Mar. 23, 1999

(30) Foreign Application Priority Data

Mar. 24, 1998 (GB) .................................................. 9806203

(51) Int. Cl.$^7$ ................................ H03D 3/00; H03K 9/00; H04L 27/14
(52) U.S. Cl. ................... 329/311; 329/319; 375/324; 375/340; 375/343; 455/214; 455/312
(58) Field of Search .................... 329/315, 344, 329/318, 311, 319; 455/214, 312; 375/324, 340, 343

(56) References Cited

U.S. PATENT DOCUMENTS 5,524,289 * 6/1996 Koblitz et al. ..................... 455/182.3

FOREIGN PATENT DOCUMENTS

| 2845483 | 5/1979 | (DE) . |
|---|---|---|
| 0473373 | 3/1992 | (EP) . |
| 0574083 | 12/1993 | (EP) . |
| 0753938 | 1/1997 | (EP) . |
| 2214742 | 9/1989 | (GB) . |
| WO86/02505 | 4/1986 | (WO) . |
| WO92/13389 | 8/1992 | (WO) . |

* cited by examiner

Primary Examiner—Siegfried H. Grimm
(74) Attorney, Agent, or Firm—Burns, Doane, Swecker & Mathis, L.L.P.

(57) ABSTRACT

A demodulator circuit for demodulating a frequency modulated input signal includes a filter (12) for receiving an incoming input signal and for providing a filtered output signal, a detector (16) for receiving the filtered output signal, and for producing a demodulated output signal therefrom, a tuning circuit (18, 20) which is operable to introduce a test signal into the demodulator circuit in the absence of an incoming input signal, and to vary the frequency response characteristics of at least one of the filter and detector in response to the test signal.

8 Claims, 2 Drawing Sheets

DEMODULATOR TUNED BY USE OF A TEST SIGNAL

The present invention relates to demodulator circuits for demodulating frequency modulated signals.

DESCRIPTION OF THE RELATED ART

Referring to FIG. 1 of the accompanying drawings, a frequency modulated radio frequency (RF) signal is conventionally received by a receiver 1 from an antenna 2, and processed by the receiver 1 to produce an FM signal at an intermediate frequency which is lower than the RF carrier frequency. The IF modulated signal is then filtered by an IF band pass filter 4 and amplitude limited to a constant amplitude by a hard limiter 5. The constant amplitude signal is then fed to a detector 6 for demodulation by multiplying the signal by its time derivative. This operation makes the product amplitude proportional to both the signal's amplitude and angular frequency (intermediate frequency IF plus FM frequency deviation). Since the FM IF signal has a constant amplitude, due to the hard limiter 5, the product signal has an amplitude proportional to the frequency deviation and the modulation signal can easily be recovered after a low-pass filter removes the signal components at multiples of the IF frequency.

Prior to detection, the FM signal has to be filtered by means of an IF filter such that adjacent channels and other out-of-channel interference is suppressed.

IF filters and FM-detectors in use today often employ passive resonator components that are trimmed, either at production or by exploiting signal properties. When the resonators are pre-tuned, they are tuned to the nominal IF frequency. FM detectors often exploit signal properties (e.g. zero mean of the detected signal) to automatically compensate for detuning. This detuning may be due to resonators being off their nominal value or the received IF signal being offset in frequency. The latter may be due to a combination of frequency offsets in the local and remote reference oscillators.

Adjusting the IF strip (IF filter and FM detector) to the nominal IF frequency does not guarantee a DC free baseband signal, even if the baseband signal nominally has a zero mean. Skewing the detector, of a properly tuned IF strip, to minimize its DC offset will compensate for local and remote reference frequency differences. This will improve sensitivity somewhat but if the linear region of the detector is not very wide, signal-dependent offsets will occur and the detector may in fact be desensitized. The detector output amplitude is smallest for alternating ones and zeroes and much larger for contiguous blocks of ones or zeroes because of inter-symbol interference in digital radio receivers. When the detector Q is high, such blocks of ones or zeroes may cause the detector to compress the signal. This compression will be asymmetric if the detector resonator or threshold is detuned to compensate DC offsets in other blocks resulting in a signal dependent offset. Similarly, in analog radio receivers signal distortion will increase when the detector is used to compensate for frequency offsets.

An FM detector with a very wide linear range will inevitably have low sensitivity and result in very small and noisy output signals. Thus, the detector sensitivity will be a compromise between signal distortion and noise.

SUMMARY OF THE PRESENT INVENTION

According to the present invention, there is provided a demodulator circuit for demodulating a frequency modulated input signal, the circuit comprising:

filter means for receiving an incoming input signal and for providing a filtered output signal;

detector means for receiving the filtered output signal, and for producing a demodulated output signal therefrom;

tuning means which are operable to introduce a test signal into the demodulator circuit in the absence of an incoming input signal, and to vary the frequency response characteristics of at least one of the filter means and detector means in response to the test signal.

DETAILED DESCRIPTION OF THE PREFERRED EMBODIMENT

Figure 1:
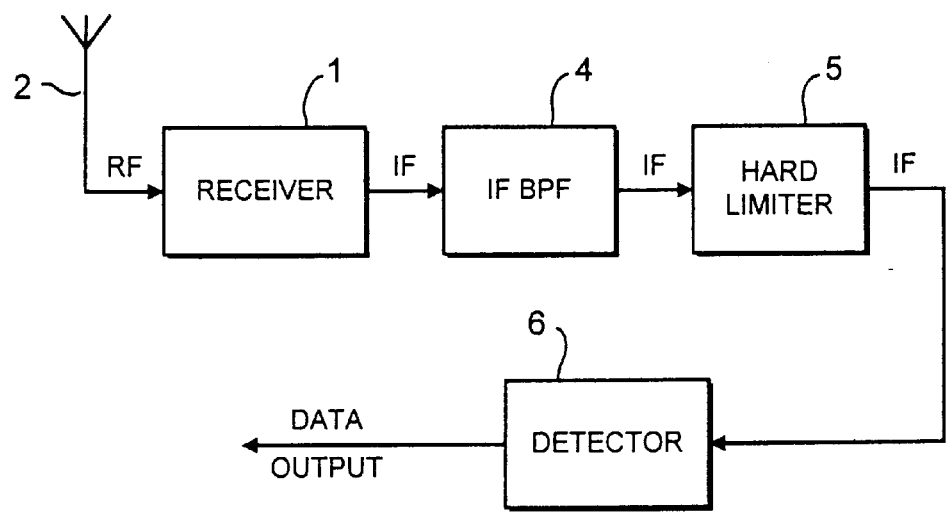
FIG. 1 is a block diagram illustrating a circuit for receiving and demodulating a frequency modulated signal.
Figure 2:
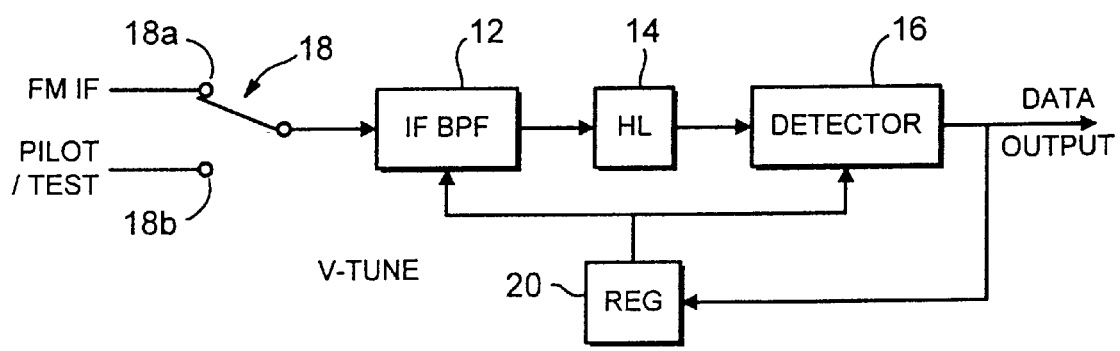
FIG. 2 is a block diagram illustrating a demodulator circuit embodying the present invention.

FIG. 2 shows a demodulator circuit embodying the present invention and comprising an intermediate frequency band pass filter 12 (IF BPF), a hard limiter 14 (HL) and a detector 16. These three components operate as described with reference to FIG. 1.

The demodulator further includes a switch arrangement 18, and a regulator 20. The switch arrangement 18 is connected between the input of the circuit and the IF BPF 12. The switch arrangement 18 has two input terminals, a first 18a connected to receive the FM intermediate frequency signal, and a second 18b connected to receive a pilot or test signal. The switch arrangement operates to selectively route either of these two signals to the IF BPF 12. The pilot or test signal is preferably at the notional intermediate frequency of the IF BPF 12 and detector 16, and can be introduced to the circuit when required, as will be explained in more detail below.

The regulator 20 receives the output signal from the detector 16 and produces a tuning signal (V_tune) to tune the frequency characteristics of the IF BPF 12 and of the detector.

In TDMA (time-domain multiple access) receivers, the receive path is not required to be active all of the time. When the receive path is not in use, the IF strip (IF BPF 12 and detector 16) are tuned by introducing the pilot or test signal at the switch arrangement 18. This injection of a test signal does not require the RF components of the receiver to be active and hence does not result in significantly increased current consumption.

During transmitting (TX) slots, or on other occasions when the receiver path is not needed, the switch arrangement 18 is set such that the test signal is fed to the IF BPF 12. When the IF strip (IF BPF 12 and detector 16) is properly tuned, and the test signal is at the intermediate frequency of the strip, there will be a zero output from the detector. Any deviations from zero are picked up by the regulator 20 which adjusts the tuning signal V_tune to force a zero output.

During receive (RX) slots the switch arrangement 18 is set to pass the incoming FM IF signal, the regulator stores the tuning voltage, and the IF strip may receive data with zero offset.

The resulting tuning and DC offset compensation signals are stored and reused when the receiver is activated.

Figure 3:
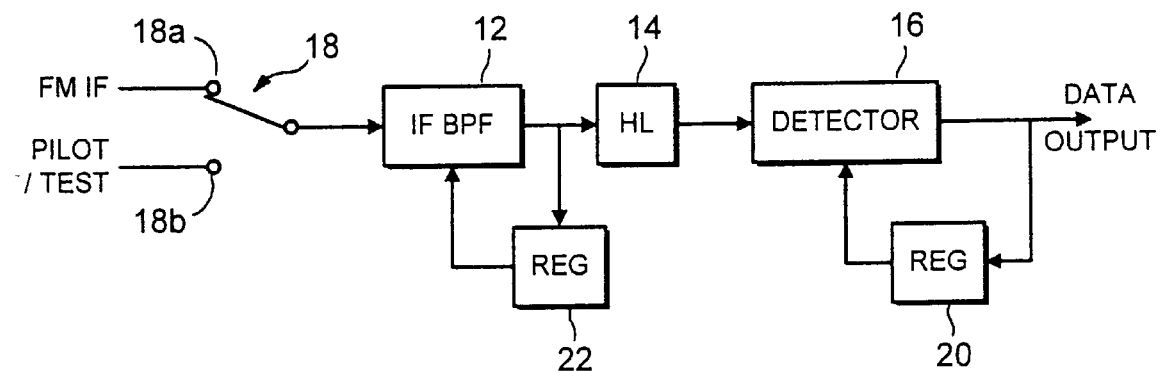
FIG. 3 is a block diagram illustrating another demodulator circuit embodying the present invention.

FIG. 2 shows the situation when the IF BPF 12 and the detector 16 are tuned in tandem based on the detector output. It is also possible to tune the IF BPF 12 by maximizing its output signal (picked up between IF BPF 12 and the hard limiter 14) via a separate maximum-seeking regulator 22 in a separate loop, as shown in FIG. 3. The detector 16 is still tuned in on the basis of forcing its output to be zero at the test signal.

Figure 4:
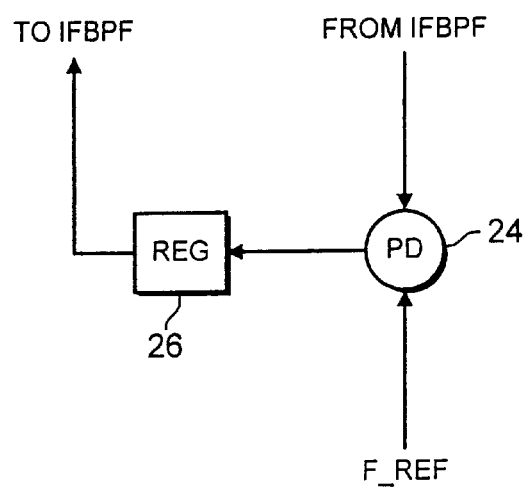
FIG. 4 is a block diagram illustrating alternative components for the circuit of FIG. 3.

An alternative to a maximum-seeking regulator for the IF BPF 12 is a phase detector and regulator combination which tunes the phase of the IF BPF 12, and hence its center frequency. Such a combination is illustrated in FIG. 4. A phase detector 24 receives the output signal from the IF BPF 12, and compares its phase with a reference signal f_ref. The output of the phase detector indicates any differences between the two signals, and this difference signal is fed back to the IF BPF 12 by way of a regulator 26.

Although it is preferable to use a test signal which produces a zero output signal, any suitable tone can be used. Thus a known deviation may be employed to enable tuning of the detector sensitivity. Although the embodiment of the present invention has been described with reference to a TDMA-based system, the invention is applicable to any receiver unit which is not constantly in use. The receiver can be retuned to the IF whenever there is an idle period in the incoming signal.

In addition, the concept is applicable to digital receivers that receive asynchronous data. If the bit rate for such a receiver drifts, the incoming signal can be interrupted and the receiver retuned using the pilot or test signal.

What is claimed is:

1. A demodulator circuit for demodulating a frequency modulated time division multiplexed input signal, the circuit comprising:

filter means for receiving an incoming time division multiplexed input signal and for providing a filtered output signal;

detector means for receiving the filtered output signal, and for producing a demodulated output signal therefrom;

tuning means which are operable to introduce a test signal into the demodulator circuit during vacant time slots of the time division multiplexed input signal, and to vary the frequency response characteristics of at least one of the filter means and detector means in response to the test signal during the said vacant time slots of the time division multiplexed input signal.

2. A circuit as claimed in claim 1, wherein the tuning means are operable to vary the frequency characteristics of the detector means on the basis of the output of the detector means in response to the input test signal.

3. A circuit as claimed in claim 1, wherein the tuning means are operable to vary the frequency characteristics of the filter means on the basis of the output of the filter means in response to the input test signal.

4. A circuit as claimed in claim 3, wherein the tuning means are operable to maximise the output of the filter means in response to the test signal input.

5. A circuit as claimed in claim 3, wherein the tuning means are operable to vary the frequency phase response of the filter means in response to the test signal input.

6. A circuit as claimed in claim 1, wherein the tuning means are operable to vary the frequency characteristics of the filter means and of the detector means on the basis of the output of the detector means in response to the input test signal.

7. A circuit as claimed in claim 1, wherein the tuning means are operable to input the test signal to the filter means.

8. A method of operating a demodulator circuit for use in demodulating an incoming frequency modulated time division multiplexed input signal, the circuit including filter means and detector means, the method comprising:

producing a demodulated data output signal from the input signal;

introducing a test signal to the filter means during vacant time slots of the time division multiplexed input signal;

adjusting the frequency response characteristics of at least one of the filter means and detector means of the demodulator circuit in response to the introduction of the test signal, during the said vacant time slots of the time division multiplexed input signal.

* * * * *